(12) United States Patent
Takama et al.

(10) Patent No.: US 10,674,650 B2
(45) Date of Patent: Jun. 2, 2020

(54) COMPONENT MOUNTING DEVICE

(71) Applicant: YAMAHA HATSUDOKI KABUSHIKI KAISHA, Iwata-shi, Shizuoka-ken (JP)

(72) Inventors: Kazushi Takama, Iwata (JP); Seiji Nakamura, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 262 days.

(21) Appl. No.: 15/742,434

(22) PCT Filed: Aug. 17, 2015

(86) PCT No.: PCT/JP2015/073054
§ 371 (c)(1),
(2) Date: Jan. 5, 2018

(87) PCT Pub. No.: WO2017/029701
PCT Pub. Date: Feb. 23, 2017

(65) Prior Publication Data
US 2018/0206369 A1    Jul. 19, 2018

(51) Int. Cl.
*H05K 13/04* (2006.01)
*G06T 7/00* (2017.01)
*H05K 13/08* (2006.01)

(52) U.S. Cl.
CPC ....... *H05K 13/0452* (2013.01); *G06T 7/0004* (2013.01); *H05K 13/083* (2018.08);
(Continued)

(58) Field of Classification Search
CPC ............... H05K 13/04; H05K 13/0404; H05K 13/0417; H05K 13/0452; H05K 13/046;
(Continued)

(56) References Cited

U.S. PATENT DOCUMENTS 5,298,977 A * 3/1994 Shintani ............. H05K 13/0815
356/603
6,317,972 B1   11/2001 Asai et al.
(Continued)

FOREIGN PATENT DOCUMENTS

JP    H07-071920 A    3/1995
JP    H08-064999 A    3/1996
(Continued)

OTHER PUBLICATIONS

Machine translation of JP 2000-013097 obtained from EPO website (Espacenet.com) on Nov. 14, 2019 (Year: 2000).*
(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

A component mounting device includes a controller that controls an imaging unit to image a predetermined region during a period from a time point at which a head finishes mounting a component at a mounting position to a time point at which the head completes upward movement from the mounting position, and acquires information about a height of the mounting position based on an imaging result of the predetermined region imaged by the imaging unit. The controller further determines whether or not the component has been successfully mounted at the mounting position based on the acquired information about the height of the mounting position.

7 Claims, 7 Drawing Sheets

(52) U.S. Cl.
CPC ..... *H05K 13/0812* (2018.08); *H05K 13/0815* (2018.08); *G06T 2207/30141* (2013.01); *Y10T 29/49131* (2015.01); *Y10T 29/53174* (2015.01)

(58) Field of Classification Search
CPC .......... H05K 13/0465; H05K 13/0469; H05K 13/08; H05K 13/081; H05K 13/0812; H05K 13/0815; H05K 13/083; Y10T 29/4913; Y10T 29/49131; Y10T 29/53174; Y10T 29/53178; Y10T 29/53191; G06T 2207/30141
See application file for complete search history.

(56) References Cited

U.S. PATENT DOCUMENTS

2003/0110610 A1\* 6/2003 Duquette ............ H04N 13/254
29/407.09
2014/0376003 A1 12/2014 Keranen

FOREIGN PATENT DOCUMENTS

| JP | 2000-013097 A | 1/2000 |
|----|---------------|--------|
| JP | 2000-151196 A | 5/2000 |
| JP | 2007-511094 A | 4/2007 |
| JP | 2007-214460 A | 8/2007 |
| JP | 2008-098411 A | 4/2008 |
| JP | 2008-103426 A | 5/2008 |
| JP | 2008-516453 A | 5/2008 |
| JP | 2013-243273 A | 12/2013 |
| JP | 2014-093390 A | 5/2014 |
| JP | 2014-216621 A | 11/2014 |
| JP | 2015-508499 A | 3/2015 |
| JP | 2015-079933 A | 4/2015 |

OTHER PUBLICATIONS

An Office Action mailed by the Korean Intellectual Property Office dated May 9, 2019, which corresponds to Korean Patent Application No. 10-2017-7034542 and is related to U.S. Appl. No. 15/742,434.
International Search Report issued in PCT/JP2015/073054; dated Nov. 17, 2015.
Written Opinion issued in PCT/JP2015/073054; dated Nov. 17, 2015.

\* cited by examiner

HEIGHT MEASUREMENT

THREE-DIMENSIONAL IMAGE OF SUCCESS OR FAILURE DETERMINATION REGION

FIG.7    COMPONENT MOUNTING PROCESSING    (FIRST EMBODIMENT)

COMPONENT MOUNTING DEVICE

CROSS-REFERENCE TO RELATED APPLICATION

This application is a National Stage of International Patent Application No. PCT/JP2015/073054, filed Aug. 17, 2015, the entire content of which is incorporated herein by reference.

TECHNICAL FIELD

The present disclosure relates to a component mounting device, and more particularly, it relates to a component mounting device that determines whether or not a component has been successfully mounted at a mounting position.

BACKGROUND ART

In general, a component mounting device that determines whether or not a component has been successfully mounted at a mounting position is known as described, for example, in Japanese Patent Laying-Open No. 2000-13097.

Japanese Patent Laying-Open No. 2000-13097 discloses a component mounting device including a suction head that suctions a component and mounts the suctioned component on a substrate and a height sensor that measures the height of the component mounted on the substrate and configured to determine whether or not the component has been successfully mounted at a mounting position based on an output signal from the height sensor. In this component mounting device, the suction head located over the mounted component is moved after the component is mounted by the suction head, and the height sensor is moved over the mounted component and measures the height of the component. Thus, this component mounting device acquires information about the height of the mounting position.

SUMMARY

However, in the component mounting device disclosed in the aforementioned Japanese Patent Laying-Open No. 2000-13097, it is necessary to move the suction head and the height sensor after mounting of the component and dispose the height sensor immediately above a height measurement position (mounting position) in order to acquire the information about the height of the mounting position for determining whether or not the component has been successfully mounted at the mounting position. Thus, the suction head and the height sensor are moved, and hence the time taken for production is disadvantageously increased.

The present disclosure has been proposed in order to solve the aforementioned problem, and an object of the present disclosure is to provide a component mounting device capable of determining whether or not a component has been successfully mounted at a mounting position while significantly reducing or preventing an increase in the time taken for production.

A component mounting device according to an aspect of the present disclosure includes a mounting section that mounts a component at a mounting position on a substrate, an imaging section capable of imaging a predetermined region including the mounting position, and a control section that controls the imaging section to image the predetermined region during a period from a time point at which the mounting section finishes mounting the component at the mounting position to a time point at which the mounting section completes upward movement from the mounting position, acquires information about a height of the mounting position based on an imaging result of the predetermined region imaged by the imaging section, and determines whether or not the component has been successfully mounted at the mounting position based on the acquired information about the height of the mounting position.

The component mounting device according to this aspect of the present disclosure is provided with the control section as described above. Thus, during the period from the time point at which the mounting section finishes mounting the component at the mounting position to the time point at which the mounting section completes upward movement from the mounting position, the predetermined region including the mounting position is imaged by the imaging section, and the information about the height of the mounting position can be acquired. Consequently, it is not necessary to move the mounting section and the imaging section after mounting of the component in order to acquire the information about the height of the mounting position for determining whether or not the component has been successfully mounted at the mounting position, and hence an increase in the time taken for production can be significantly reduced or prevented. Therefore, it is possible to determine whether or not the component has been successfully mounted at the mounting position while significantly reducing or preventing an increase in the time taken for production.

In the aforementioned component mounting device according to this aspect, the control section is preferably configured to acquire information about a height of a substrate surface of the substrate in a vicinity of the mounting position in addition to the information about the height of the mounting position based on the imaging result. According to this structure, it is possible to acquire the information about the height of the substrate surface in addition to the information about the height of the mounting position while significantly reducing or preventing an increase in a loss of the time taken for production.

In this case, the control section is preferably configured to determine whether or not the component has been successfully mounted at the mounting position based on the information about the height of the mounting position taking into account the acquired information about the height of the substrate surface. According to this structure, it is possible to determine whether or not the component has been successfully mounted at the mounting position in consideration of the actual height of the substrate surface. Consequently, it is possible to accurately determine whether or not the component has been successfully mounted at the mounting position as compared with the case where the actual height of the substrate surface is not taken into account.

In the aforementioned component mounting device according to this aspect, the control section is preferably configured to determine whether or not the component has been successfully mounted at the mounting position by determining whether or not a predetermined amount or more of a portion having a height equal to or more than a predetermined height is included based on the information about the height of the mounting position. According to this structure, it is possible to make a success or failure determination based on a wide range of measurement results by determining whether or not a predetermined amount or more of the portion having a height equal to or more than the predetermined height is included, and hence it is possible to more accurately determine whether or not the component has been successfully mounted at the mounting position.

In the aforementioned component mounting device according to this aspect, the control section is preferably configured to control the imaging section to image the predetermined region before and after mounting of the component, to acquire the information about the height of the mounting position before and after mounting of the component based on imaging results of the predetermined region before and after mounting of the component imaged by the imaging section, and to determine whether or not the component has been successfully mounted at the mounting position based on a change in the acquired information about the height of the mounting position before and after mounting of the component. According to this structure, it is possible to make a success or failure determination for the component at the mounting position based on a change in the actual height of the mounting position (a change in the height of the mounting position due to mounting of the component). Consequently, it is possible to more accurately determine whether or not the component has been successfully mounted at the mounting position as compared with the case where a success or failure determination for the component at the mounting position is made based only on the height information after mounting of the component. This effect is particularly beneficial when it is determined whether or not a small-sized component, which is difficult to distinguish from an object such as a solder placed at the mounting position, has been successfully mounted.

The aforementioned component mounting device according to this aspect preferably further includes an image processing section that generates a difference image between an image of the mounting position before mounting of the component captured by the imaging section and an image of the mounting position after mounting of the component captured by the imaging section, and the control section is preferably configured to determine whether or not the component has been successfully mounted at the mounting position based on the generated difference image in addition to the information about the height of the mounting position. According to this structure, it is possible to make a success or failure determination for the component at the mounting position based not only on the information about the height of the mounting position but also on the generated difference image, and hence it is possible to more accurately determine whether or not the component has been successfully mounted at the mounting position.

In the aforementioned component mounting device according to this aspect, the imaging section is preferably configured to be capable of imaging the mounting position from a plurality of imaging directions, and the control section is preferably configured to control the imaging section to image the predetermined region from the plurality of imaging directions during the period from the time point at which the mounting section finishes mounting the component at the mounting position to the time point at which the mounting section completes upward movement from the mounting position, and to acquire the information about the height of the mounting position based on imaging results of the predetermined region imaged by the imaging section from the plurality of imaging directions. According to this structure, it is possible to easily acquire the information about the height of the mounting position based on the imaging results of the predetermined region imaged by the imaging section from the plurality of imaging directions.

In this case, the imaging section is preferably configured to be capable of imaging the mounting position from the plurality of imaging directions inclined with respect to the substrate surface. According to this structure, the mounting position can be imaged from the oblique directions, and hence the mounting position can easily fit within the field of view of the imaging section without moving the imaging section after mounting.

According to the present disclosure, as hereinabove described, the component mounting device capable of determining whether or not the component has been successfully mounted at the mounting position while significantly reducing or preventing an increase in the time taken for production can be provided.

DETAILED DESCRIPTION

Embodiments embodying the present disclosure are hereinafter described on the basis of the drawings.

First Embodiment (Structure of Component Mounting Device)
The structure of a component mounting device 100 according to a first embodiment of the present disclosure is now described with reference to FIGS. 1 to 6.

Figure 1:
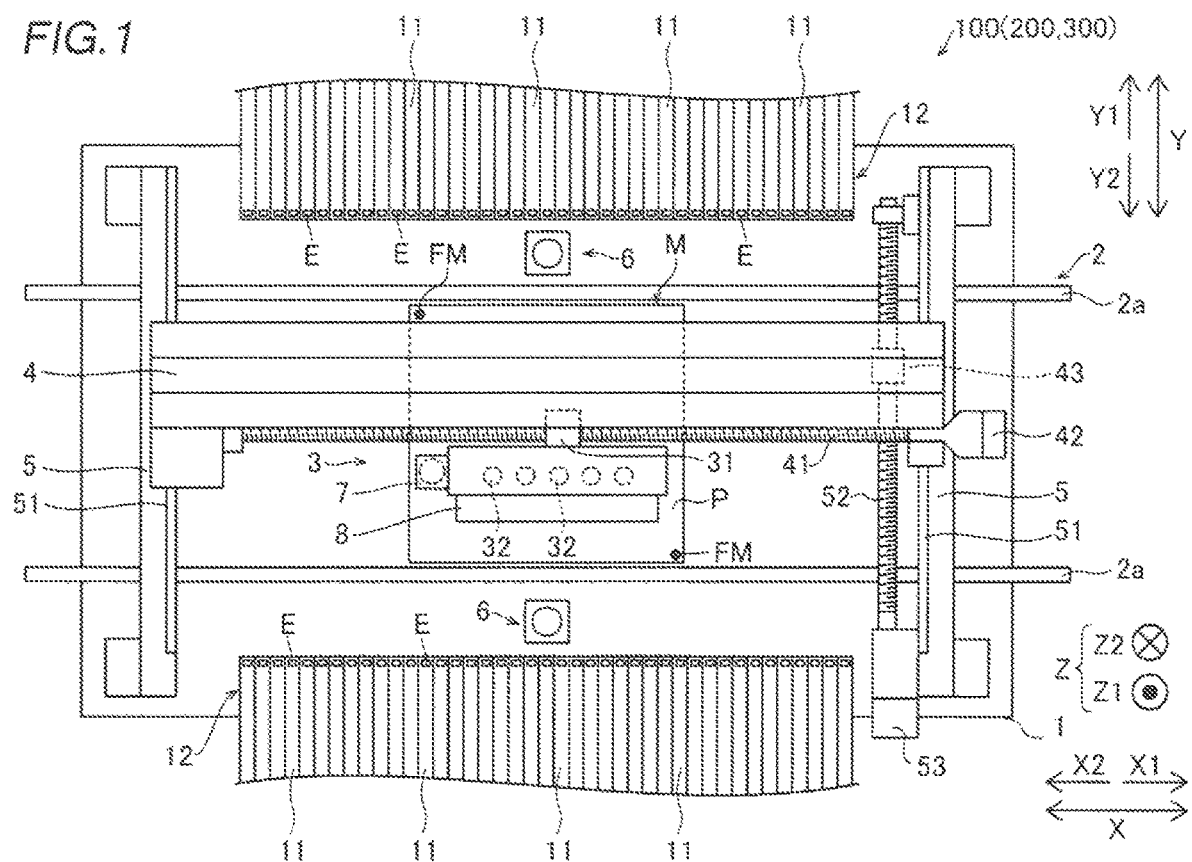
FIG. 1 is a diagram showing the overall structure of a component mounting device according to a first embodiment of the present disclosure.

As shown in FIG. 1, the component mounting device 100 is a device that mounts components E (electronic components), such as ICs, transistors, capacitors, and resistors, on a substrate P such as a printed board. The component mounting device 100 includes a base 1, a conveyance portion 2, a head unit 3, a support 4, rails 5, component recognition cameras 6, a substrate recognition camera 7, an imaging unit 8, and a controller 9 (see FIG. 2). The imaging unit 8 is an example of an "imaging apparatus" or an "imaging section." The controller 9 is an example of a "controller" or a "control section."

Feeder placement portions 12 for arranging a plurality of tape feeders 11 are respectively provided on both ends (a Y1 side and a Y2 side) of the base 1 in a direction Y. The tape feeders 11 hold reels (not shown) on which tapes that hold a plurality of components E at a predetermined interval are wound. The tape feeders 11 are configured to feed the components E from the tips of the tape feeders 11 by rotating the reels to feed the tapes that hold the components E.

The respective tape feeders 11 are placed in the feeder placement portions 12 in a state where the tape feeders 11 are electrically connected to the controller 9 via connectors (not shown) provided in the feeder placement portions 12. Thus, the respective tape feeders 11 are configured to feed the tapes from the reels and feed the components E based on a control signal from the controller 9. At this time, the respective tape feeders 11 are configured to feed the components E according to the mounting operation of the head unit 3.

The conveyance portion 2 includes a pair of conveyors 2a. The conveyance portion 2 has a function of conveying the substrate P in a horizontal direction (direction X) by the pair of conveyors 2a. Specifically, the conveyance portion 2 has a function of carrying in the substrate P before mounting from an upstream (X1 side) conveyance path (not shown), conveying the carried-in substrate P to a mounting operation position M, and carrying out the substrate P, on which mounting has been completed, to a downstream (X2 side) conveyance path (not shown). The conveyance portion 2 is configured to hold and fix the substrate P stopped at the mounting operation position M by a substrate fixing mechanism (not shown) such as a clamping mechanism.

The pair of conveyors 2a of the conveyance portion 2 are configured to be capable of conveying the substrate P in the horizontal direction (direction X) while supporting the substrate P from below. Furthermore, the pair of conveyors 2a are configured such that an interval therebetween in the direction Y can be adjusted. Accordingly, it is possible to adjust the interval between the pair of conveyors 2a in the direction Y according to the size of the substrate P to be carried in.

The head unit 3 is configured to mount a component E at a mounting position Pa (see FIG. 3) on the substrate P fixed at the mounting operation position M. The head unit 3 includes a ball nut 31, five heads 32, five Z-axis motors 33 (see FIG. 2) respectively provided on the five heads 32, and five R-axis motors 34 (see FIG. 2) respectively provided on the five heads 32. The heads 32 are examples of a "mounting apparatus" or a "mounting section."

The five heads 32 are arranged in a line along the direction X on the lower surface side of the head unit 3. Nozzles 32a (see FIG. 3) are attached to the respective tips of the five heads 32. The heads 32 are configured to be capable of suctioning and holding the components E fed from the tape feeders 11 by a negative pressure generated at the tips of the nozzles 32a by a negative pressure generator (not shown).

Furthermore, the heads 32 are configured to be capable of going up and down in an upward-downward direction (direction Z). Specifically, the heads 32 are configured to be capable of going up and down between a position in a lowered state at the time of suctioning or mounting the component E and a position in a raised state at the time of conveying or imaging the component E. In the head unit 3, each of the five heads 32 is configured to be capable of individually going up and down by a Z-axis motor 33 provided for each head 32. Furthermore, each of the five heads 32 is configured to be individually rotatable about the central axis (about the direction Z) of a nozzle 32a by an R-axis motor 34 provided for each head 32.

The head unit 3 is configured to be movable in the direction X along the support 4. Specifically, the support 4 includes a ball screw shaft 41, an X-axis motor 42 that rotates the ball screw shaft 41, and a guide rail (not shown) that extends in the direction X. The ball screw shaft 41 is rotated by the X-axis motor 42 such that the head unit 3 can move in the direction X along the support 4 together with the ball nut 31 engaged with the ball screw shaft 41 (into which the ball screw shaft 41 is screwed).

The support 4 is configured to be movable in the direction Y perpendicular to the direction X along a pair of rails 5 fixed on the base 1. Specifically, the rails 5 include a pair of guide rails 51 that support both ends of the support 4 in the direction X such that the support 4 is movable in the direction Y, a ball screw shaft 52 that extends in the direction Y, and a Y-axis motor 53 that rotates the ball screw shaft 52. Furthermore, the support 4 is provided with a ball nut 43 engaged with the ball screw shaft 52 (into which the ball screw shaft 52 is screwed). The ball screw shaft 52 is rotated by the Y-axis motor 53 such that the support 4 can move in the direction Y along the pair of rails 5 together with the ball nut 43 engaged with the ball screw shaft 52 (into which the ball screw shaft 52 is screwed).

According to this structure, the head unit 3 is configured to be movable on the base 1 in the direction X and the direction Y. Thus, the head unit 3 can move above the tape feeders 11, for example, and can suction the component E fed from the tape feeders 11. Furthermore, the head unit 3 can move above the fixed substrate P at the mounting operation position M, for example, and can mount the suctioned component E on the substrate P.

The component recognition cameras 6 are configured to image the components E suctioned by the heads 32 in order to recognize the suction states of the components E prior to mounting of the components E. The component recognition cameras 6 are fixed on the upper surface of the base 1 and are configured to image the components E suctioned by the heads 32 from below (direction Z2) the components E. These imaging results are acquired by the controller 9. Thus, the controller 9 can recognize the suction states (the rotational orientations and the suction positions with respect to the heads 32) of the components E based on the imaging results of the suctioned components E.

The substrate recognition camera 7 is configured to image position recognition marks (fiducial marks) FM provided on the substrate P prior to mounting of the components E. The position recognition marks FM are marks for recognizing the substrate P. On the substrate P shown in FIG. 1, a pair of position recognition marks FM are provided at a lower right position and an upper left position on the substrate P. The imaging result of these position recognition marks FM is acquired by the controller 9. Then, the controller 9 can recognize the accurate position and orientation of the substrate P fixed by the substrate fixing mechanism (not shown) based on the imaging result of the position recognition marks FM.

Furthermore, the substrate recognition camera 7 is mounted on an X2-side portion of the head unit 3, and is configured to be movable on the base 1 in the direction X and the direction Y together with the head unit 3. The substrate recognition camera 7 is configured to move on the base 1 in the direction X and the direction Y and image the position recognition marks FM provided on the substrate P from above (direction Z1) the substrate P.

Figure 3:
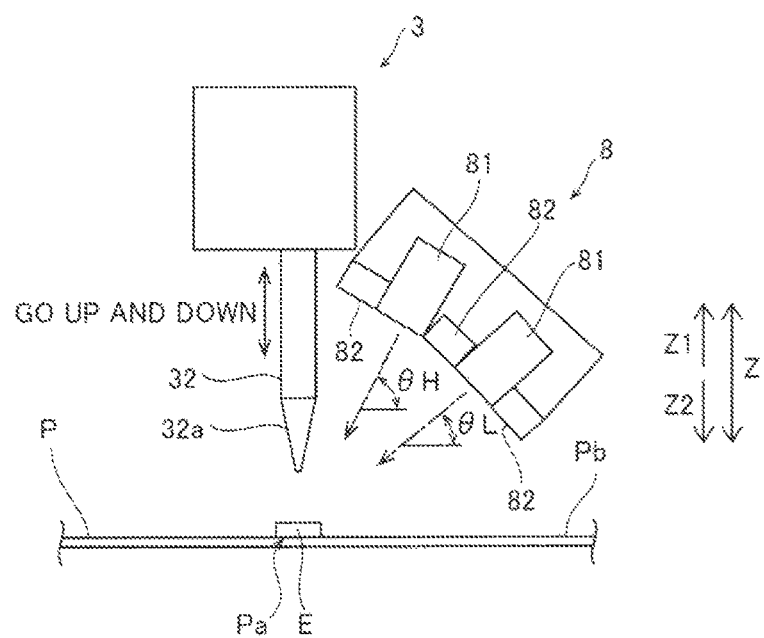
FIG. 3 is a side elevational view showing the imaging state of an imaging unit of the component mounting device according to the first embodiment of the present disclosure.

As shown in FIGS. 1 and 3, the imaging unit 8 is configured to be capable of imaging a predetermined region including the mounting position Pa on the substrate P in order to determine whether or not the component E has been successfully mounted at the mounting position Pa. The imaging unit 8 includes a plurality of mounting position recognition cameras 81 and a plurality of illumination sections 82. According to the first embodiment, the imaging unit 8 is provided with two mounting position recognition cameras 81 and three illumination sections 82 for each head 32.

As shown in FIG. 3, the two mounting position recognition cameras 81 are configured to be capable of imaging the predetermined region including the mounting position Pa on the substrate P from different imaging directions from each other. Specifically, a mounting position recognition camera 81 on the upper side (Z1 side) is configured to be capable of imaging the predetermined region including the mounting position Pa on the substrate P from an imaging direction inclined at an inclination angle θH (0 degrees<θH<90 degrees) with respect to a horizontal plane (a plane substantially parallel to a substrate surface Pb on which the component E is mounted) From the imaging direction in which the substrate P is mounted on the substrate P. In addition, a mounting position recognition camera 81 on the lower side (Z2 side) is configured to be capable of imaging the predetermined region including the mounting position Pa on the substrate P from an imaging direction inclined at an inclination angle θL (0 degrees<θL<θH) with respect to the horizontal plane (the plane substantially parallel to the substrate surface Pb on which the component E is mounted).

Thus, the imaging unit 8 is configured to be capable of imaging the predetermined region including the mounting position Pa from a plurality of imaging directions inclined with respect to the substrate surface Pb. The imaging results of the predetermined region including the mounting position Pa are acquired by the controller 9. Then, the controller 9 acquires height information (information about the height of the mounting position Pa and information about the height of the substrate surface Pb) described below by stereo matching based on the two imaging results of the predetermined region including the mounting position Pa from the two imaging directions.

The illumination sections 82 are provided in the vicinity of the mounting position recognition cameras 81 and are configured to emit light when the mounting position recognition cameras 81 capture images. In addition, the illumination sections 82 each include a light source such as an LED (light-emitting diode).

As shown in FIG. 1, the imaging unit 8 is mounted on a Y2-side portion of the head unit 3. Thus, the imaging unit 8 is configured to be movable on the base 1 in the direction X and the direction Y together with the head unit 3. Furthermore, the imaging unit 8 is configured to be capable of imaging the mounting position Pa in a state where the imaging unit 8 is stationary at a predetermined position when imaging the mounting position Pa.

Figure 2:
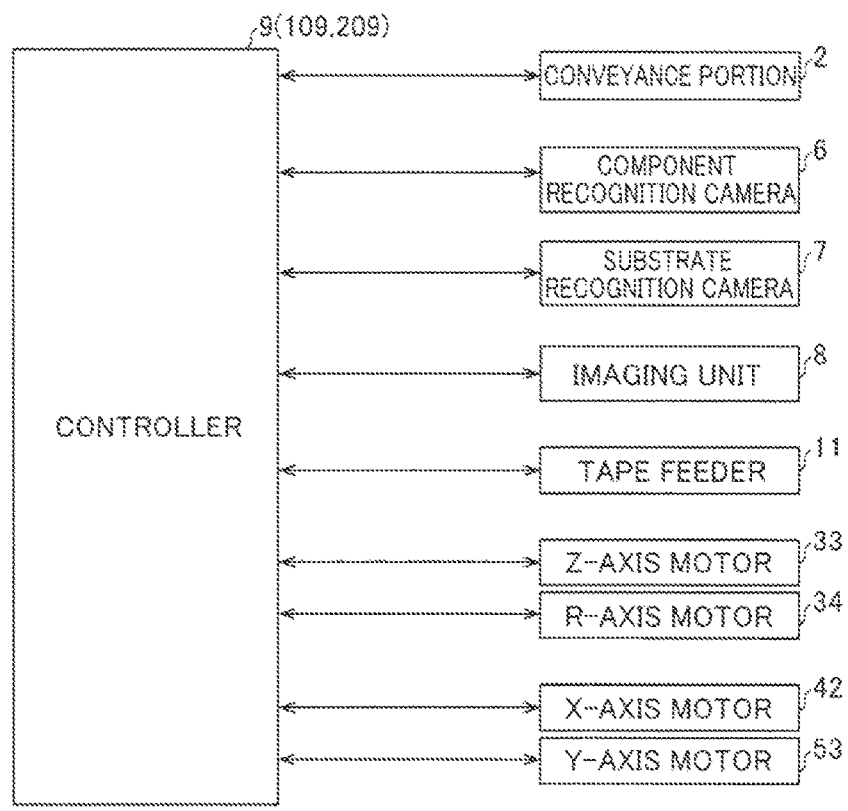
FIG. 2 is a block diagram showing the control structure of the component mounting device according to the first embodiment of the present disclosure.

As shown in FIG. 2, the controller 9 includes a CPU (central processing unit), a ROM (read only memory), a RAM (random access memory), etc., and is configured to control the operation of the component mounting device 100. Specifically, the controller 9 controls the conveyance portion 2, the X-axis motor 42, the Y-axis motor 53, the Z-axis motor 33, the R-axis motor 34, etc. according to programs stored in advance to mount the components E on the substrate P.

More specifically, the controller 9 moves the head unit 3 above the tape feeders 11, generates a negative pressure at the nozzles 32a of the heads 32 by the negative pressure generator (not shown), and controls the nozzles 32a to suction the components E fed from the tape feeders 11. Then, the controller 9 moves the head unit 3 from above the tape feeders 11 to above the substrate P in order to mount the suctioned components E on the substrate P. During this movement, the controller 9 moves the head unit 3 such that the head unit 3 passes above the component recognition cameras 6, and controls the component recognition cameras 6 to image the components E suctioned by the respective heads 32.

Then, when the head unit 3 reaches above the substrate P fixed at the substrate operation position M, the controller 9 moves the heads 32 down above the mounting position Pa, and mounts the suctioned components E on the substrate P by stopping supply of a negative pressure to the heads 32 at the predetermined timing.

(Structure of Controller Involving Success or Failure Determination)

According to the first embodiment, the controller 9 is configured to control the imaging unit 8 to image the predetermined region including the mounting position Pa during a period from a time point at which one of the heads 32 finishes mounting the component E at the mounting position Pa to a time point at which the head 32 completes upward movement from the mounting position Pa, and to acquire the information about the height of the mounting position Pa and the information about the height of the substrate surface Pb of the substrate P in the vicinity of the mounting position Pa based on the imaging result of the predetermined region imaged by the imaging unit 8. Furthermore, the controller 9 is configured to determine whether or not the component E has been successfully mounted at the mounting position Pa based on the information about the height of the mounting position Pa taking into account the information about the height of the substrate surface Pb.

Specifically, the controller 9 first controls the two mounting position recognition cameras 81 of the imaging unit 8 to image the predetermined region from the plurality of imaging directions substantially simultaneously during the period from the time point at which the head 32 finishes mounting the component E at the mounting position Pa to the time point at which the head 32 completes upward movement from the mounting position Pa. Furthermore, the controller 9 acquires the information about the height of the mounting position Pa and the information about the height of the substrate surface Pb by stereo matching based on the imaging results of the predetermined region imaged substantially simultaneously by the two mounting position recognition cameras 81 of the imaging unit 8 from the plurality of imaging directions.

Figure 4:
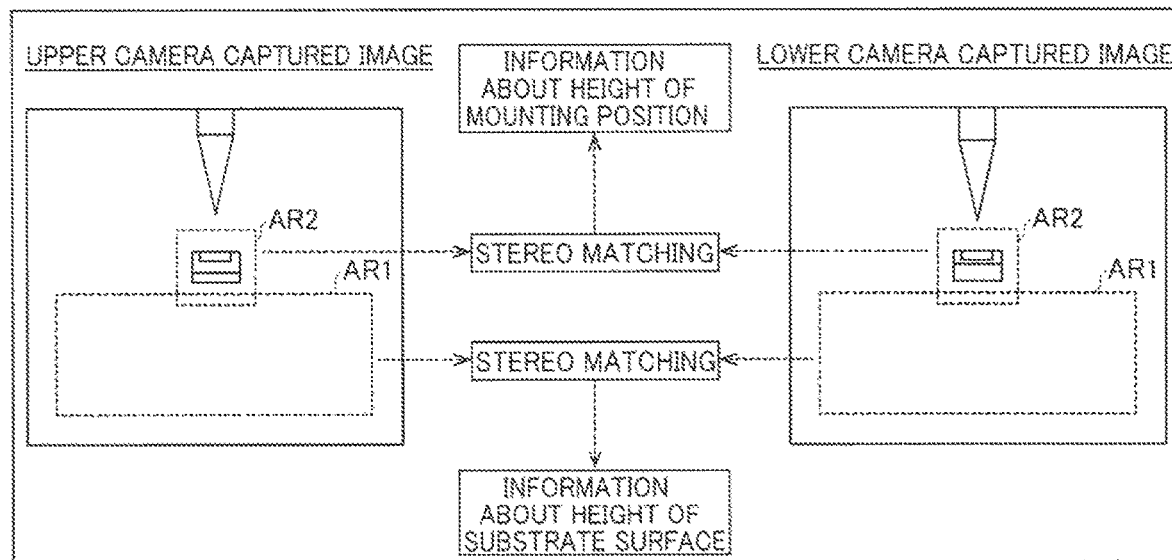
FIG. 4 is a diagram for illustrating a method for acquiring information about the height of a mounting position and information about the height of a substrate surface by stereo matching in the component mounting device according to the first embodiment of the present disclosure.

Specifically, as shown in FIG. 4, the controller 9 sets a first region AR1 for acquiring (calculating) the information about the height of the substrate surface Pb in each of an image of the predetermined region captured by the upper (Z1 side) mounting position recognition camera 81 (hereinafter referred to as the upper camera captured image) and an image of the predetermined region captured by the lower (Z2 side) mounting position recognition camera 81 (hereinafter referred to as the lower camera captured image) in order to acquire the information about the height of the substrate surface Pb. At this time, the first region AR1 is set on a side (the lower side of the plane of the figure) opposite to a position where the head 32 appears in the upward-downward direction of the captured images. Then, the controller 9 acquires the information about the height of the substrate surface Pb by stereo matching between an image of the first region AR1 in the upper camera captured image and an image of the first region AR1 in the lower camera captured image.

Furthermore, the controller 9 sets a second region AR2 for acquiring the information about the height of the mounting position Pa in each of the upper camera captured image and the lower camera captured image in order to acquire the information about the height of the mounting position Pa. At this time, the second region AR2 is set so as to include the mounting position Pa where the component E is mounted in the upward-downward direction of the captured images. Then, the controller 9 acquires the information about the height of the mounting position Pa by stereo matching between an image of the second region AR2 in the upper camera captured image and an image of the second region AR2 in the lower camera captured image. The second region AR2 is also a success or failure determination region.

A method for acquiring the information about the height of the mounting position Pa and the information about the height of the substrate surface Pb by stereo matching is now described with reference to FIG. 5.

Figure 5:
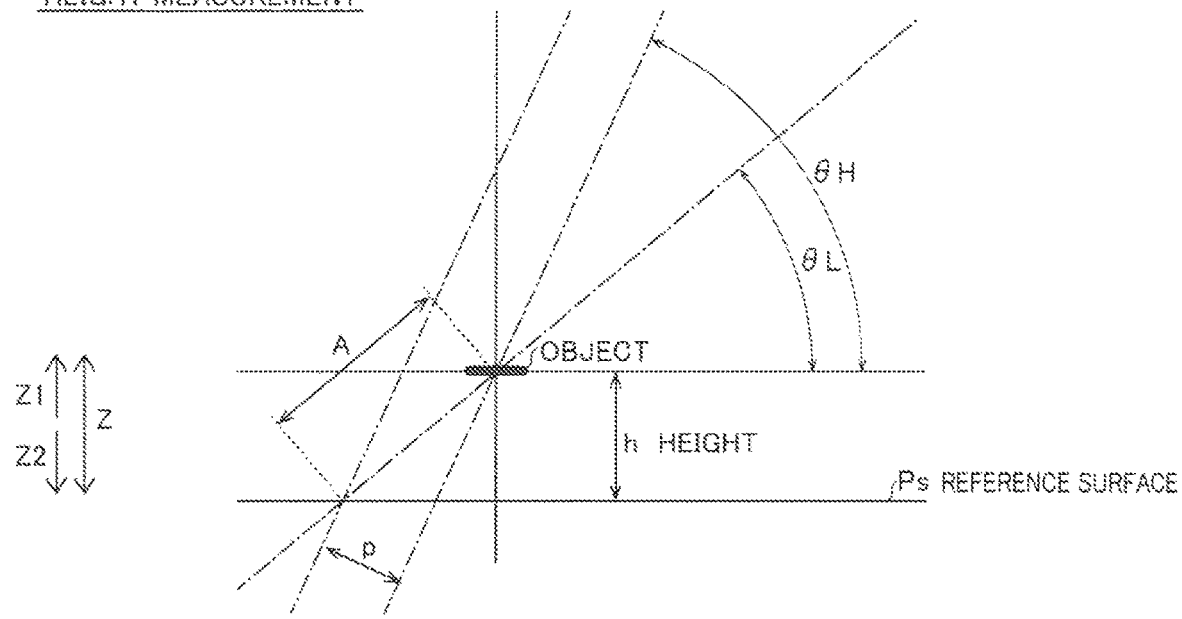
FIG. 5 is a diagram for illustrating a height calculation method by stereo matching in the component mounting device according to the first embodiment of the present disclosure.

As shown in FIG. 5, the predetermined region including an object, the height of which is acquired, such as the substrate surface Pb or the mounting position Pa is imaged substantially simultaneously from the two imaging directions with the inclination angle θH and the inclination angle θL by the two mounting position recognition cameras 81. Then, stereo matching between the image (the image of the first region AR1 or AR2 in the upper camera captured image) captured from the imaging direction with the inclination angle θH and the image (the image of the first region AR1 or AR2 in the lower camera captured image) captured from the imaging direction with the inclination angle θL is performed such that a parallax p (pixel) between the two captured images is obtained. Here, assuming that the camera resolution of the mounting position recognition cameras 81 is R (μm/pixel), a distance A (μm) is obtained from the following expression (1).

$$A = p \times R / \sin(\theta H - \theta L) \quad (1)$$

In addition, the height h (μm) of the object with respect to a reference surface Ps is obtained from the following expression (2) using the distance A obtained from the expression (1).

$$h = A \times \sin(\theta L) \quad (2)$$

Thus, the information about the height of the substrate surface Pb with respect to the reference surface Ps and the information about the height of the mounting position Pa with respect to the reference surface Ps are acquired by the controller 9. The component E is mounted at the mounting position Pa, and hence when mounting has been normally performed, information about the height of the component E mounted at the mounting position Pa is acquired as the information about the height of the mounting position Pa.

As the height information, any information may be used so far as the same is information that correlates with the height h. For example, information of the height h shown in FIG. 5 may be used as the height information, or information of the distance A that correlates with the height h or information such as information of the parallax p may be used as the height information. In addition, the method for acquiring the height information by stereo matching is not restricted to the above example, but any method may be used.

Furthermore, the controller 9 is configured to acquire the information about the height of the mounting position Pa taking into account the height of the substrate surface Pb by subtracting (a value of) the information about the height of the substrate surface Pb from (a value of) the acquired information about the height of the mounting position Pa. In other words, the controller 9 is configured to acquire the information about the height of the mounting position Pa with respect to the substrate surface Pb based on the information about the height of the mounting position Pa and the information about the height of the substrate surface Pb. Thus, the actual warpage (positional deviation in a height direction) of the substrate surface Pb can be taken into account, and hence even when warpage (positional deviation in the height direction) occurs on the substrate surface Pb, the accurate information about the height of the mounting position Pa that corresponds to the thickness of the component E mounted at the mounting position Pa can be acquired.

According to the first embodiment, the controller 9 is configured to determine whether or not the component E has been successfully mounted at the mounting position Pa by determining whether or not a predetermined amount or more of a portion having a height equal to or more than a predetermined height is included in this information about the height of the mounting position Pa based on the information about the height of the mounting position Pa taking into account the height of the substrate surface Pb. The predetermined height is a height for determining whether or not the component E has been normally mounted at the mounting position Pa, and is set based on the thickness of the component E mounted at the mounting position Pa, for example. The predetermined amount is an amount for determining whether or not the component E has been normally mounted at the mounting position Pa, and is set based on the area of the upper surface of the component E mounted at the mounting position Pa, for example.

Figure 6:
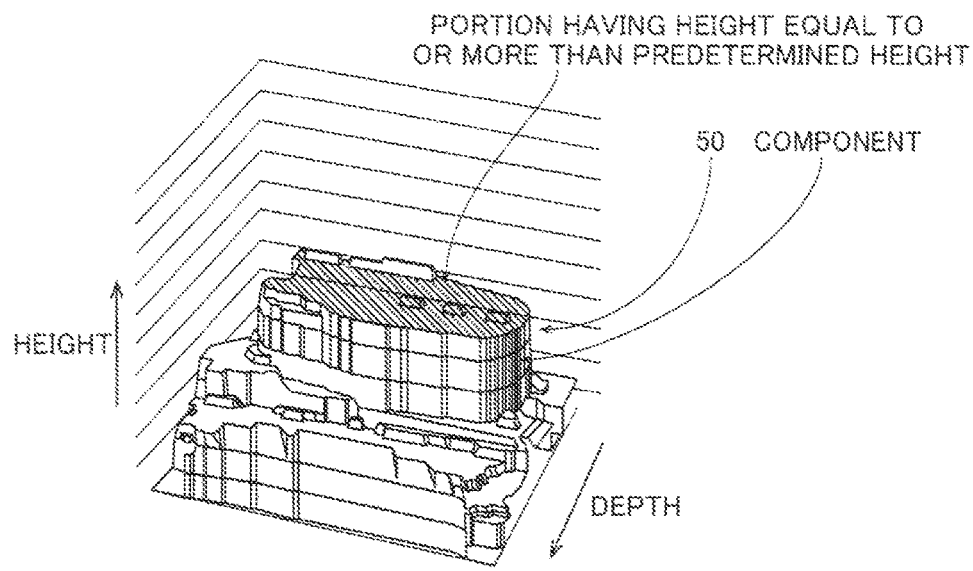
FIG. 6 is a diagram showing a three-dimensional image of a success or failure determination region generated based on results of stereo matching in the component mounting device according to the first embodiment of the present disclosure.

Specifically, as shown in FIG. 6, the controller 9 is configured to acquire (generate) a three-dimensional image 50 of the second region (success or failure determination region) AR2 (see FIG. 4) based on the information about the height of the mounting position Pa taking into account the height of the substrate surface Pb and determine whether or not the component E has been successfully mounted at the mounting position Pa by determining whether or not a predetermined amount or more of the portion (shown by hatching in FIG. 6) having a height equal to or more than the predetermined height is included in the acquired three-dimensional image 50.

Furthermore, the controller 9 is configured to determine that the component E has been successfully mounted (the component E has been normally mounted) at the mounting position Pa when a predetermined amount or more of the portion having a height equal to or more than the predetermined height is included in the acquired three-dimensional image 50. The controller 9 is also configured to determine that the component E has been unsuccessfully mounted (an abnormality has occurred in mounting of the component E) at the mounting position Pa when a predetermined amount or more of the portion having a height equal to or more than the predetermined height is not included in the acquired three-dimensional image 50.

(Structure of Controller Involving Correction of Success or Failure Determination Region)

The controller 9 is configured to correct the second region AR2 based on the recognition result of the suction state of the component E according to the imaging result of either of the component recognition cameras 6 and the information about the height of the substrate surface Pb when setting the second region AR2 (see FIG. 4). Specifically, the controller 9 is configured to correct the position of the second region AR2 in a transverse direction in the captured image based on the recognition result of the suction state of the component E according to the imaging result of either of the component recognition cameras 6. In addition, the controller 9 is configured to correct the position of the second region AR2 in a longitudinal direction in the captured image based on the information about the height of the substrate surface Pb. Consequently, even when the component E is suctioned by the head 32 in a state where the component E is positionally deviated and when substrate warpage (positional deviation in the height direction) occurs, for example, the second region AR2 can be set in an accurate position.

(Component Mounting Processing)

Figure 7:
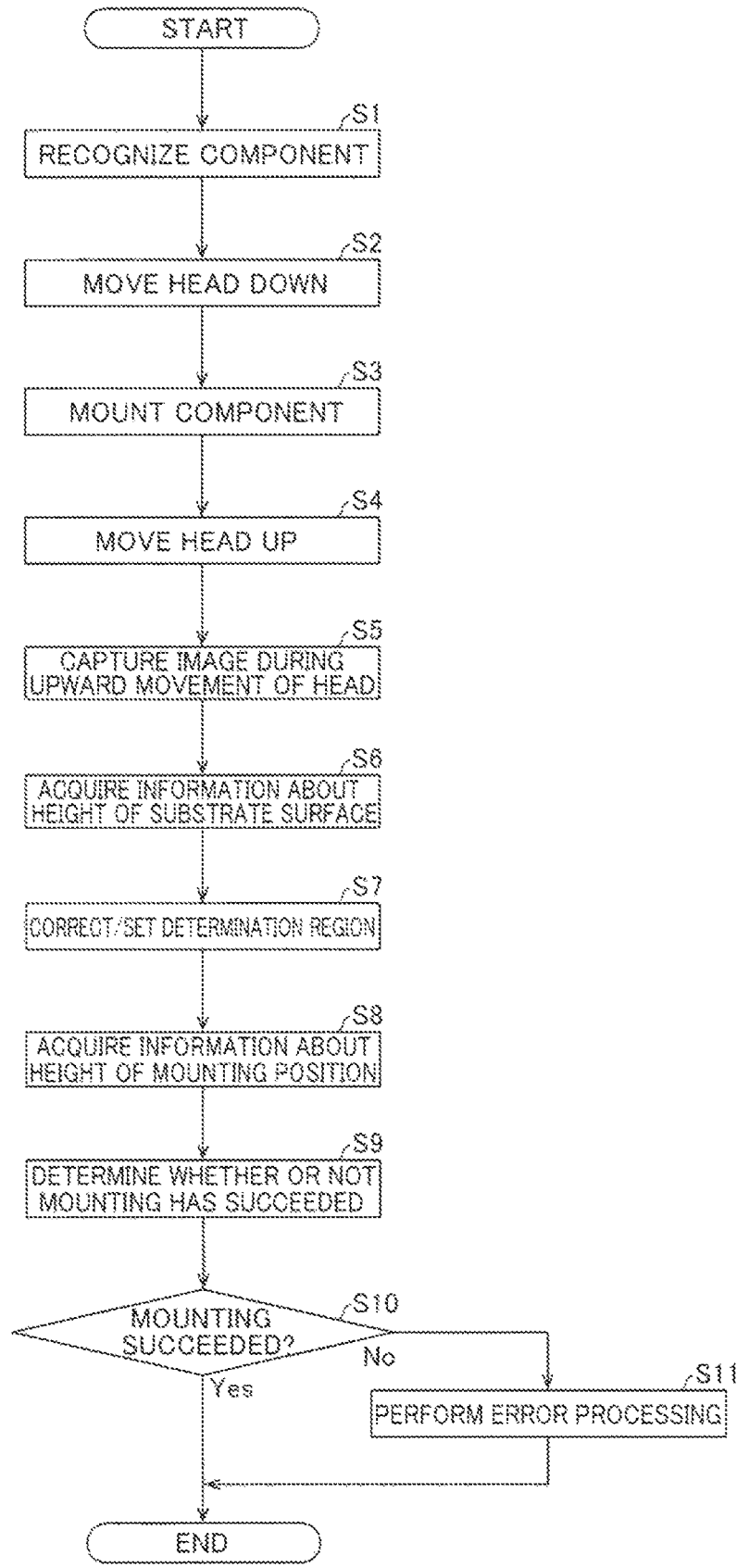
FIG. 7 is a flowchart for illustrating component mounting processing performed by the component mounting device according to the first embodiment of the present disclosure.

Component mounting processing including the aforementioned imaging operation for success or failure determination is now described based on a flowchart with reference to FIG. 7. The component mounting processing is performed by the controller 9.

As shown in FIG. 7, first, in step S1, either of the component recognition cameras 6 images the component E suctioned by the head 32, and the suction state of the component E is recognized based on this imaging result. Thereafter, the head unit 3 is moved from above either of the component recognition cameras 6 to above the substrate P.

Then, when the head unit 3 reaches above the substrate P, the head 32 that has suctioned the component E is moved down toward the mounting position Pa in step S2. Then, in step S3, the component E suctioned by the head 32 is mounted at the mounting position Pa on the substrate P.

Then, in step S4, the head 32 is moved up from the mounting position Pa after mounting the component E. Then, in step S5, the predetermined region including the mounting position Pa is imaged by the imaging unit 8 during the period from the time point at which the head 32 finishes mounting the component E at the mounting position Pa to the time point at which the head 32 completes upward movement from the mounting position Pa. At this time, the predetermined region is imaged substantially simultaneously by the two mounting position recognition cameras 81 of the imaging unit 8. Thus, two captured images of the upper camera captured image and the lower camera captured image (see FIG. 4) are acquired.

Then, the first region AR1 (see FIG. 4) is set in each of the upper camera captured image and the lower camera captured image. Then, in step S6, stereo matching between the image of the first region AR1 in the upper camera captured image and the image of the first region AR1 in the lower camera captured image is performed to acquire the information about the height of the substrate surface Pb.

Then, in step S7, the second region (success or failure determination region) AR2 (see FIG. 4) is set in each of the upper camera captured image and the lower camera captured image. At this time, the second region AR2 is set in a state where the second region AR2 has been corrected based on the recognition result of the suction state of the component E according to the imaging result of either of the component recognition cameras 6 and the information about the height of the substrate surface Pb.

Then, in step S8, stereo matching between the image of the second region AR2 in the upper camera captured image and the image of the second region AR2 in the lower camera captured image is performed to acquire the information about the height of the mounting position Pa. Furthermore, (the value of) the information about the height of the substrate surface Pb acquired in step S6 is subtracted from (the value of) the acquired information about the height of the mounting position Pa such that the information about the height of the mounting position Pa taking into account the height of the substrate surface Pb is acquired.

Then, the three-dimensional image 50 (see FIG. 6) of the second region AR2 is acquired based on the information about the height of the mounting position Pa taking into account the height of the substrate surface Pb. Then, in step S9, it is determined whether or not a predetermined amount or more of the portion having a height equal to or more than the predetermined height is included in the acquired three-dimensional image 50 such that it is determined whether or not the component E has been successfully mounted at the mounting position Pa.

Specifically, when a predetermined amount or more of the portion having a height equal to or more than the predetermined height is included in the acquired three-dimensional image 50, the thickness that corresponds to that of the component E mounted at the mounting position Pa is detected, and hence it is determined that the component E has been successfully mounted (the component E has been normally mounted) at the mounting position Pa. When a predetermined amount or more of the portion having a height equal to or more than the predetermined height is not included in the acquired three-dimensional image 50, the thickness that corresponds to that of the component E mounted at the mounting position Pa is not detected, and hence it is determined that the component E has been unsuccessfully mounted (an abnormality has occurred in mounting of the component E) at the mounting position Pa.

Then, in step S10, it is determined whether or not the mounting has succeeded. When it is determined that the mounting has succeeded, the component mounting processing is terminated. When determining that the mounting has not succeeded (failed), the controller 9 advances to step S11.

Then, in step S11, error processing is performed. In this error processing, the component mounting device 100 is stopped, and the captured image (captured image during upward movement of the head 32) acquired in the step S5 is output, for example. Thereafter, the component mounting processing is terminated.

Effects of First Embodiment

According to the first embodiment, the following effects can be obtained.

According to the first embodiment, as hereinabove described, the component mounting device 100 includes the controller 9 that controls the imaging unit 8 to image the predetermined region during the period from the time point at which the head 32 finishes mounting the component E at the mounting position Pa to the time point at which the head 32 completes upward movement from the mounting position Pa, acquires the information about the height of the mounting position Pa based on the imaging result of the predetermined region imaged by the imaging unit 8, and determines whether or not the component E has been successfully mounted at the mounting position Pa based on the acquired information about the height of the mounting position Pa. Thus, during the period from the time point at which the head 32 finishes mounting the component E at the mounting position Pa to the time point at which the head 32 completes upward movement from the mounting position Pa, the predetermined region including the mounting position Pa is imaged by the imaging unit 8, and the information about the height of the mounting position Pa can be acquired. Consequently, it is not necessary to move the head 32 and the imaging unit 8 after mounting of the component E in order to acquire the information about the height of the mounting position Pa for determining whether or not the component E has been successfully mounted at the mounting position Pa, and hence an increase in the time taken for production can be significantly reduced or prevented. Therefore, it is possible to determine whether or not the component E has been successfully mounted at the mounting position Pa while significantly reducing or preventing an increase in the time taken for production.

According to the first embodiment, as hereinabove described, the controller 9 is configured to acquire the information about the height of the substrate surface Pb of the substrate P in the vicinity of the mounting position Pa in addition to the information about the height of the mounting position Pa based on the imaging result. Thus, it is possible to acquire the information about the height of the substrate surface Pb in addition to the information about the height of the mounting position Pa while significantly reducing or preventing an increase in the time taken for production.

According to the first embodiment, as hereinabove described, the controller 9 is configured to determine whether or not the component E has been successfully mounted at the mounting position Pa based on the information about the height of the mounting position Pa taking into account the acquired information about the height of the substrate surface Pb. Thus, it is possible to determine whether or not the component E has been successfully mounted at the mounting position Pa in consideration of the actual height of the substrate surface Pb. Consequently, it is possible to accurately determine whether or not the component E has been successfully mounted at the mounting position Pa as compared with the case where the actual height of the substrate surface Pb is not taken into account.

According to the first embodiment, as hereinabove described, the controller 9 is configured to determine whether or not the component E has been successfully mounted at the mounting position Pa by determining whether or not a predetermined amount or more of the portion having a height equal to or more than the predetermined height is included based on the information about the height of the mounting position Pa. Thus, it is possible to make a success or failure determination based on a wide range of measurement results by determining whether or not a predetermined amount or more of the portion having a height equal to or more than the predetermined height is included, and hence it is possible to more accurately determine whether or not the component E has been successfully mounted at the mounting position Pa.

According to the first embodiment, as hereinabove described, the imaging unit 8 is configured to be capable of imaging the mounting position Pa from the plurality of imaging directions. Furthermore, the controller 9 is configured to control the imaging unit 8 to image the predetermined region from the plurality of imaging directions during the period from the time point at which the head 32 finishes mounting the component E at the mounting position Pa to the time point at which the head 32 completes upward movement from the mounting position Pa, and to acquire the information about the height of the mounting position Pa based on the imaging results of the predetermined region imaged by the imaging unit 8 from the plurality of imaging directions. Thus, it is possible to easily acquire the information about the height of the mounting position Pa based on the imaging results of the predetermined region imaged by the imaging unit 8 from the plurality of imaging directions.

According to the first embodiment, as hereinabove described, the imaging unit 8 is configured to be capable of imaging the mounting position Pa from the plurality of imaging directions inclined with respect to the substrate surface Pb. Thus, the mounting position Pa can be imaged from the oblique directions, and hence the mounting position Pa can easily fit within the field of view of the imaging unit 8 without moving the imaging unit 8 after mounting.

Second Embodiment

A second embodiment is now described with reference to FIGS. 1 to 4 and 8 to 10. In this second embodiment, an example in which a success or failure determination is made based on a change in height information based on imaging results of a predetermined region before and after mounting is described unlike the aforementioned first embodiment in which a success or failure determination is made based on the height information based on the imaging result of the predetermined region after mounting.

(Structure of Component Mounting Device)

As shown in FIG. 2, a component mounting device 200 (see FIG. 1) according to the second embodiment of the present disclosure is different from the component mounting device 100 according to the aforementioned first embodiment in that the component mounting device 200 includes a controller 109. The controller 109 is an example of a "controller" or a "control section." The same structures as those of the aforementioned first embodiment are denoted by the same reference numerals, and description thereof is omitted.

(Structure of Controller Involving Success or Failure Determination)

According to the second embodiment, the controller 109 is configured to control an imaging unit 8 to image a predetermined region before and after mounting of a component E, and to acquire information about the height of a mounting position Pa (see FIG. 3) before and after mounting of the component E based on the imaging results of the predetermined region before and after mounting of the component E imaged by the imaging unit 8. Furthermore, the controller 109 is configured to make a success or failure determination for the component E at the mounting position Pa based on a change in the acquired information about the height of the mounting position Pa before and after mounting of the component E.

Specifically, according to the second embodiment, the controller 109 is configured to control two mounting position recognition cameras 81 of the imaging unit 8 to image the predetermined region substantially simultaneously from a plurality of imaging directions during a period from a time point at which one of heads 32 waits above the mounting position Pa to a time point at which the head 32 completes downward movement to the mounting position Pa. Furthermore, the controller 109 is configured to acquire the information about the height of the mounting position Pa before mounting of the component E and information about the height of a substrate surface Pb before mounting of the component E by stereo matching based on the imaging results of the predetermined region imaged by the two mounting position recognition cameras 81 of the imaging unit 8 from the plurality of imaging directions.

Moreover, the controller 109 is configured to control the two mounting position recognition cameras 81 of the imaging unit 8 to image the predetermined region substantially simultaneously from the plurality of imaging directions during a period from a time point at which the head 32 finishes mounting the component E at the mounting position Pa to a time point at which the head 32 completes upward movement from the mounting position Pa. In addition, the controller 109 is configured to acquire the information about the height of the mounting position Pa after mounting of the component E and information about the height of the substrate surface Pb after mounting of the component E by stereo matching based on the imaging results of the predetermined region imaged by the two mounting position recognition cameras 81 of the imaging unit 8 from the plurality of imaging directions. A method for acquiring the height information by stereo matching, acquisition of the information about the height of the mounting position Pa taking into account the substrate surface Pb, correction of a second region (success or failure determination region) AR2 (see FIG. 4), etc. are similar to those according to the aforementioned first embodiment, and hence detailed description thereof is omitted.

Figure 8:
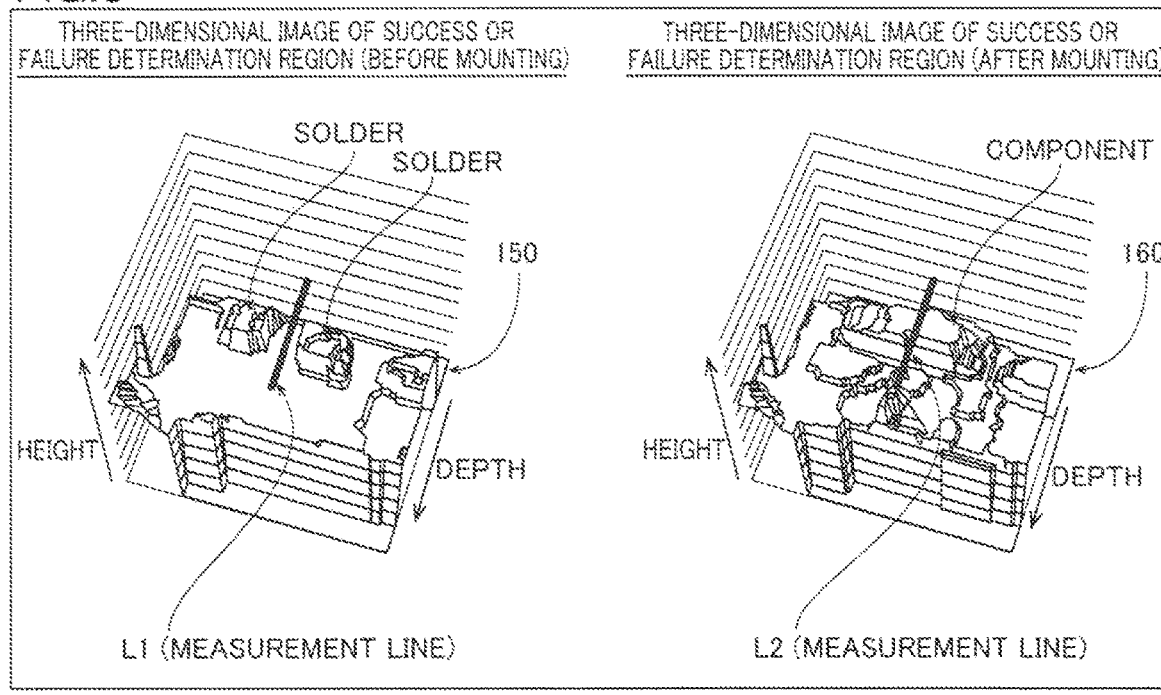
FIG. 8 is a diagram showing three-dimensional images of a success or failure determination region before and after mounting generated based on a result of stereo matching in a component mounting device according to a second embodiment of the present disclosure.

According to the second embodiment, as shown in FIG. 8, the controller 109 is configured to acquire a three-dimensional image 150 of the second region AR2 (see FIG. 4) before mounting of the component E based on the information about the height of the mounting position Pa before mounting of the component E taking into account the height of the substrate surface Pb. Furthermore, the controller 109 is configured to acquire a three-dimensional image 160 of the second region AR2 after mounting of the component E based on the information about the height of the mounting position Pa after mounting of the component E taking into account the height of the substrate surface Pb.

Figure 9:
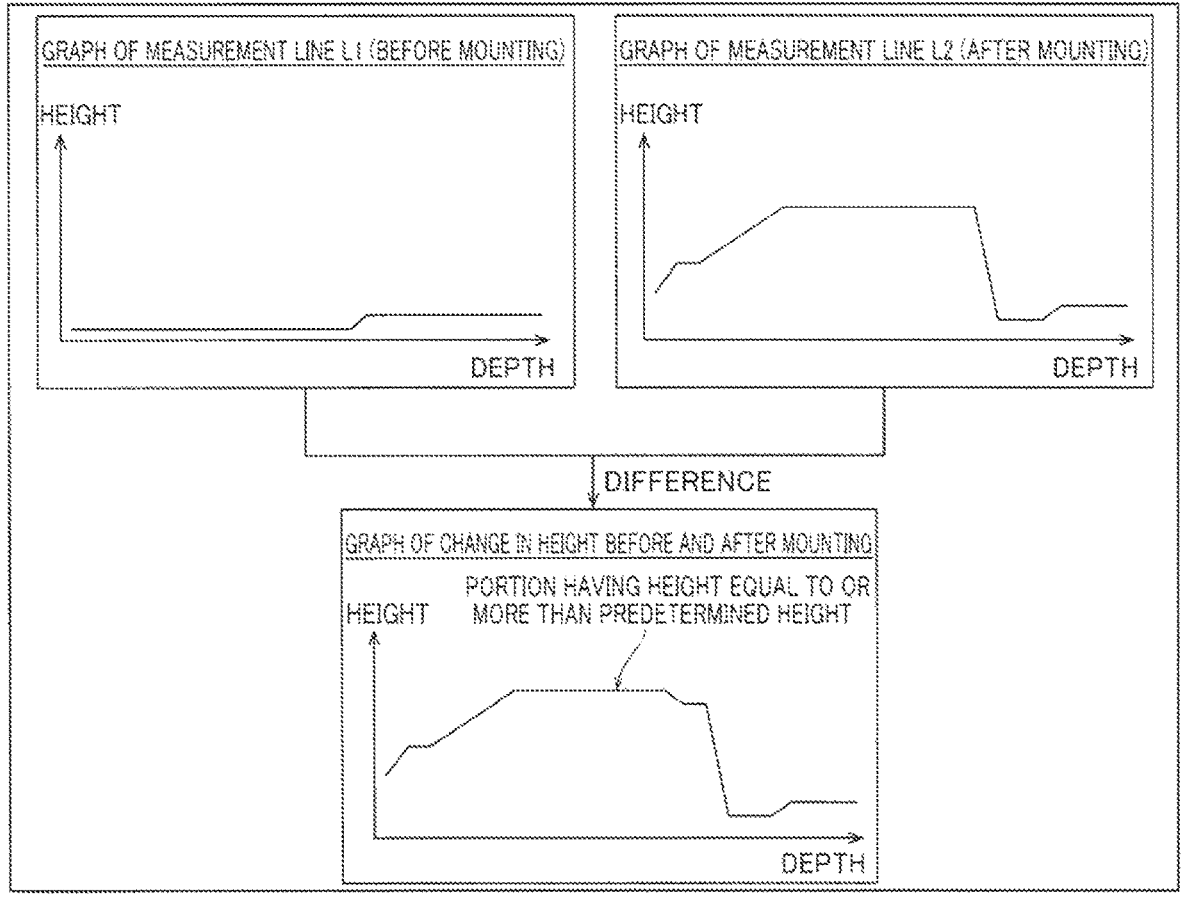
FIG. 9 is a diagram for illustrating a method for acquiring a change in height information before and after mounting in the component mounting device according to the second embodiment of the present disclosure.

As shown in FIGS. 8 and 9, the controller 109 is configured to set a measurement line L1 for acquiring height information on a predetermined line in the three-dimensional image 150 before mounting of the component E, and to set a measurement line L2 that corresponds to the measurement line L1 in the three-dimensional image 160 after mounting of the component E. Furthermore, the controller 109 is configured to acquire (a value of) the height information on the measurement line L1 in the three-dimensional image 150 before mounting of the component E and (a value of) the height information on the measurement line L2 in the three-dimensional image 160 after mounting of the component E.

Moreover, the controller 109 is configured to acquire a change in the information about the height of the mounting position Pa before and after mounting of the component E (a graph of a height change before and after mounting shown in FIG. 9, for example) by subtracting (the value of) the acquired height information after mounting of the component E that corresponds to the measurement line L1 from (the value of) the height information that corresponds to the measurement line L2. According to the second embodiment, the measurement line L1 of the three-dimensional image 150 before mounting is set in a portion where no object such as a solder is placed from the viewpoint of significantly reducing or preventing erroneous determination due to the thickness of an object such as a solder placed in the vicinity of the mounting position Pa. Even when the measurement line L1 is set in a portion where an object such as a solder is placed, the thickness of the object such as a solder is canceled out by subtracting (the value of) the acquired height information after mounting of the component E that corresponds to the measurement line L1 from (the value of) the height information that corresponds to the measurement line L2, and hence erroneous determination due to the thickness of the object such as a solder can be significantly reduced or prevented.

The controller 109 is configured to determine whether or not the component E has been successfully mounted at the mounting position Pa by determining whether or not a predetermined amount (a predetermined number of voxels) or more of a portion having a height equal to or more than a predetermined height is included in the acquired change in the information about the height of the mounting position Pa before and after mounting of the component E based on this change in the information about the height of the mounting position Pa before and after mounting of the component E. The predetermined height is a height for determining whether or not the component E has been normally mounted at the mounting position Pa, and is set based on the thickness of the component E mounted at the mounting position Pa, for example. The predetermined amount is an amount for determining whether or not the component E has been normally mounted at the mounting position Pa, and is set based on the length of the upper surface of the component E mounted at the mounting position Pa, for example.

In addition, the controller 109 is configured to determine that the component E has been successfully mounted (the component E has been normally mounted) at the mounting position Pa when a predetermined amount or more of the portion having a height equal to or more than the predetermined height is included in the acquired change in the information about the height of the mounting position Pa before and after mounting of the component E. The controller 109 is configured to determine that the component E has been unsuccessfully mounted (an abnormality has occurred in mounting of the component E) at the mounting position Pa when a predetermined amount or more of the portion having a height equal to or more than the predetermined height is not included in the acquired change in the information about the height of the mounting position Pa before and after mounting of the component E.

(Component Mounting Processing)

Figure 10:
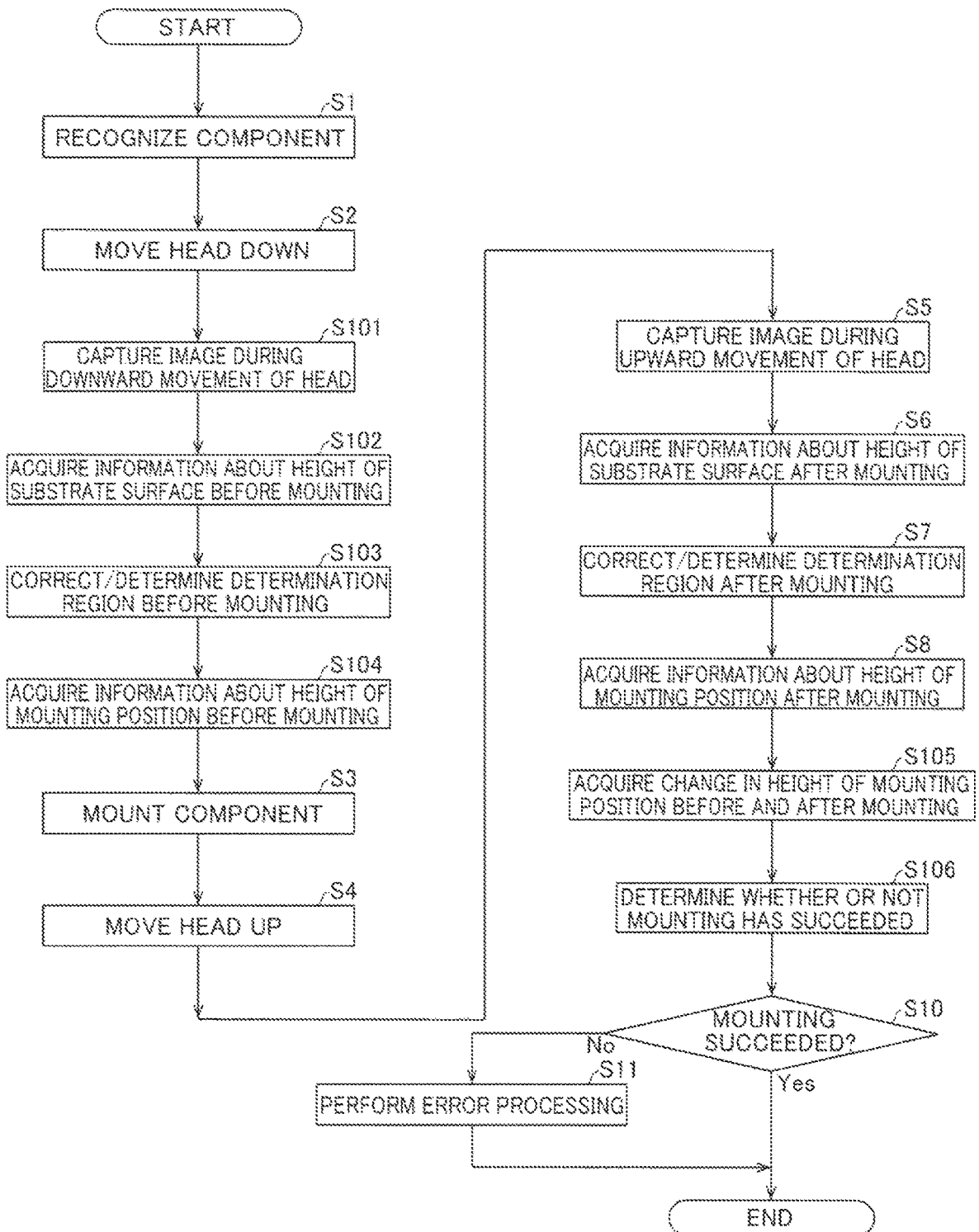
FIG. 10 is a flowchart for illustrating component mounting processing performed by the component mounting device according to the second embodiment of the present disclosure.

Component mounting processing according to the second embodiment is now described based on a flowchart with reference to FIG. 10. The component mounting processing is performed by the controller 109. The same processing operations as those of the aforementioned first embodiment are denoted by the same reference numerals, and description thereof is omitted.

As shown in FIG. 10, first, processing in steps S1 and S2 are performed similarly to the aforementioned first embodiment. Then, in step S101, the predetermined region including the mounting position Pa before mounting of the component E is imaged by the imaging unit 8 during the period from the time point at which the head 32 waits above the mounting position Pa to the time point at which the head 32 completes downward movement to the mounting position Pa. At this time, the predetermined region before mounting of the component E is imaged substantially simultaneously by the two mounting position recognition cameras 81 of the imaging unit 8. Thus, two captured images of an image of the predetermined region captured by the upper (Z1 side) mounting position recognition camera 81 (hereinafter referred to as the upper camera captured image) and an image of the predetermined region captured by the lower (Z2 side) mounting position recognition camera 81 (hereinafter referred to as the lower camera captured image) (see FIG. 4) are acquired.

Then, the first region AR1 (see FIG. 4) is set in each of the upper camera captured image and the lower camera captured image. Then, in step S102, stereo matching between an image of the first region AR1 in the upper camera captured image and an image of the first region AR1 in the lower camera captured image is performed to acquire the information about the height of the substrate surface Pb before mounting of the component E.

Then, in step S103, the second region (success or failure determination region) AR2 (see FIG. 4) is set in each of the upper camera captured image and the lower camera captured image. At this time, the second region AR2 is set in a state where the second region AR2 has been corrected based on a recognition result of the suction state of the component E according to an imaging result of either of component recognition cameras 6 and the information about the height of the substrate surface Pb before mounting of the component E.

Then, in step S104, stereo matching between the image of the second region AR2 in the upper camera captured image and the image of the second region AR2 in the lower camera captured image is performed to acquire the information about the height of the mounting position Pa before mounting of the component E. Furthermore, the information about the height of the mounting position Pa taking into account the height of the substrate surface Pb is acquired by subtracting (a value of) the information about the height of the substrate surface Pb acquired in the step S102 from (a value of) the acquired information about the height of the mounting position Pa.

Then, the processing in steps S3 to S8 is performed similarly to the aforementioned first embodiment. Thus, the information about the height of the mounting position Pa after mounting of the component E is acquired.

Then, the three-dimensional image 150 (see FIG. 8) of the second region AR2 (see FIG. 4) before mounting of the component E and the three-dimensional image 160 (see FIG. 8) of the second region AR2 after mounting of the component E are acquired based on the information about the height of the mounting position Pa before and after mounting of the component E. Then, in step S105, a change in the information about the height of the mounting position Pa before and after mounting of the component E is acquired based on the three-dimensional image 150 and the three-dimensional image 160.

Then, in step S106, it is determined whether or not a predetermined amount or more of the portion (see FIG. 9) having a height equal to or more than the predetermined height is included in the change in the information about the height of the mounting position Pa before and after mounting of the component E such that it is determined whether or not the component E has been successfully mounted at the mounting position Pa. Specifically, when a predetermined amount or more of the portion having a height equal to or more than the predetermined height is included in the change in the information about the height of the mounting position Pa before and after mounting of the component E, the thickness that corresponds to that of the component E mounted at the mounting position Pa is detected, and hence it is determined that the component E has been successfully mounted (the component E has been normally mounted) at the mounting position Pa. When a predetermined amount or more of the portion having a height equal to or more than the predetermined height is not included in the change in the information about the height of the mounting position Pa before and after mounting of the component E, the thickness that corresponds to that of the component E mounted at the mounting position Pa is not detected, and hence it is determined that the component E has been unsuccessfully mounted (an abnormality has occurred in mounting of the component E) at the mounting position Pa.

Then, in step S10, it is determined whether or not the mounting has succeeded. When it is determined that the mounting has succeeded, the component mounting processing is terminated. When determining that the mounting has not succeeded (failed), the controller 109 advances to step S11.

Then, in step S11, error processing is performed. In this error processing, the component mounting device 200 is stopped, and the captured images (captured images during downward movement and upward movement of the head 32) acquired in the steps S101 and S5 are output, for example. Thereafter, the component mounting processing is terminated.

The remaining structures of the second embodiment are similar to those of the aforementioned first embodiment.

Effects of Second Embodiment

According to the second embodiment, the following effects can be obtained. According to the second embodiment, as hereinabove described, the controller 109 is configured to control the imaging unit 8 to image the predetermined region before and after mounting of the component E, to acquire the information about the height of the mounting position Pa before and after mounting of the component E based on the imaging results of the predetermined region before and after mounting of the component E imaged by the imaging unit 8, and to make a success or failure determination for the component E at the mounting position Pa based on the change in the acquired information about the height of the mounting position Pa before and after mounting of the component E. Thus, it is possible to make a success or failure determination for the component E at the mounting position Pa based on a change in the actual height of the mounting position Pa (a change in the height of the mounting position Pa due to mounting of the component E). Consequently, it is possible to more accurately determine whether or not the component E has been successfully mounted at the mounting position Pa as compared with the case where a success or failure determination for the component E at the mounting position Pa is made based only on the height information after mounting of the component E. This effect is particularly beneficial when it is determined whether or not a small-sized component E, which is difficult to distinguish from an object such as a solder placed at the mounting position Pa, has been successfully mounted.

The remaining effects of the second embodiment are similar to those of the aforementioned first embodiment.

Third Embodiment

A third embodiment is now described with reference to FIGS. 1 to 4 and 11. In this third embodiment, in addition to the structure of the aforementioned first embodiment or the structure of the aforementioned second embodiment, an example in which a success or failure determination is made based on a difference image between captured images before and after mounting is described.

(Structure of Component Mounting Device)

As shown in FIG. 2, a component mounting device 300 (see FIG. 1) according to the third embodiment of the present disclosure is different from the component mounting device 100 according to the aforementioned first embodiment and the component mounting device 200 according to the aforementioned second embodiment in that the component mounting device 300 includes a controller 209. The controller 209 is an example of a "control section," "a controller," an "image processing section" or an "image processor." The same structures as those of the aforementioned first and second embodiments are denoted by the same reference numerals, and description thereof is omitted.

(Structure of Controller Involving Success or Failure Determination)

Figure 11:
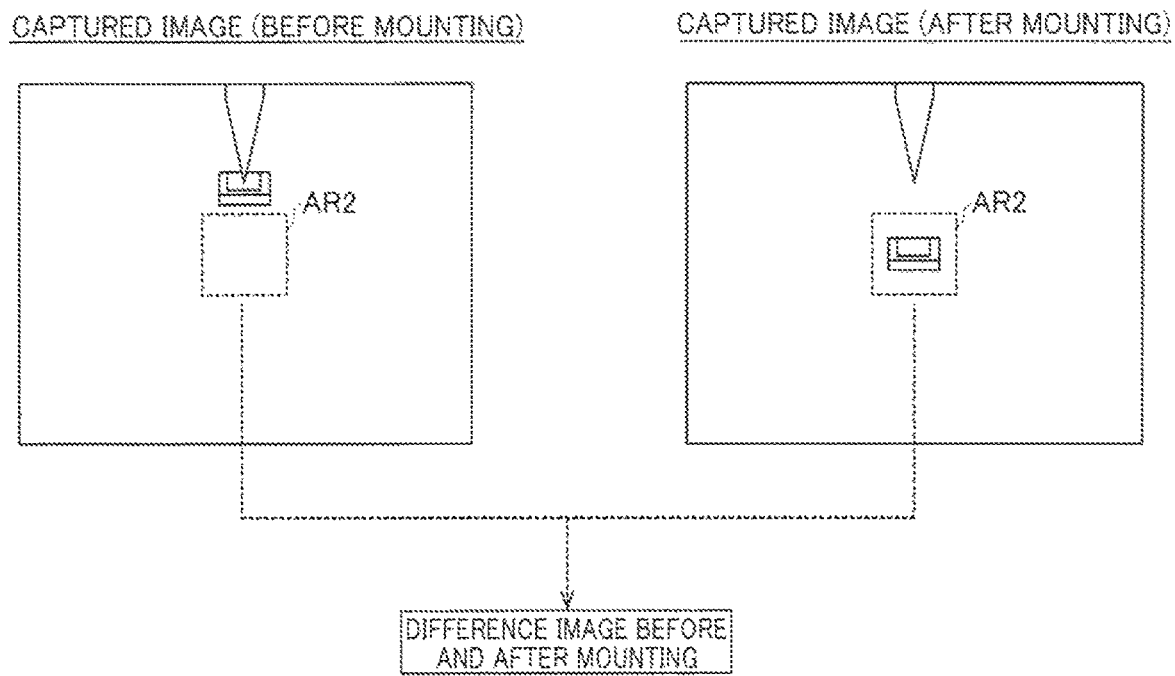
FIG. 11 is a diagram for illustrating a method for acquiring a difference image between captured images before and after mounting in a component mounting device according to a third embodiment of the present disclosure.

According to the third embodiment, the controller 209 is configured to control an imaging unit 8 to image a predetermined region before and after mounting of a component E. Furthermore, as shown in FIG. 11, the controller 209 is configured to generate a difference image between an image of a second region AR2 including a mounting position Pa (see FIG. 3) before mounting of the component E imaged by the imaging unit 8 and an image of the second region AR2 including the mounting position Pa after mounting of the component E imaged by the imaging unit 8.

According to the third embodiment, the controller 209 is configured to make a success or failure determination for the component E at the mounting position Pa based on the generated difference image in addition to making a success or failure determination based on information about the height of the mounting position Pa as in the aforementioned first embodiment or making a success or failure determination based on a change in the information about the height of the mounting position Pa as in the aforementioned second embodiment. As the captured images of the mounting position Pa before and after mounting for acquiring the difference image, imaging results by any one of two mounting position recognition cameras 81 may be used so far as the same are imaging results by the same mounting position recognition camera 81.

According to the third embodiment, the controller 209 is configured to determine that the component E has been successfully mounted (the component E has been normally mounted) at the mounting position Pa when determining that the mounting has succeeded in both or one of the success or failure determination based on the height information or a change in the height information and the success or failure determination based on the difference image. Furthermore, the controller 209 is configured to determine that the component E has been unsuccessfully mounted (an abnormality has occurred in mounting of the component E) at the mounting position Pa when determining that the mounting has failed in one or both of the success or failure determination based on the height information or a change in the height information and the success or failure determination based on the difference image.

The remaining structures of the third embodiment are similar to those of the aforementioned first or second embodiment.

Effects of Third Embodiment

According to the third embodiment, the following effects can be obtained.

According to the third embodiment, as hereinabove described, the controller 209 is configured to generate the difference image between the image of the mounting position Pa before mounting of the component E captured by the imaging unit 8 and the image of the mounting position Pa after mounting of the component E captured by the imaging unit 8. Furthermore, the controller 209 is configured to determine whether or not the component E has been successfully mounted at the mounting position Pa based on the generated difference image in addition to the information about the height of the mounting position Pa. Thus, it is possible to make a success or failure determination for the component E at the mounting position Pa based not only on the information about the height of the mounting position Pa but also on the generated difference image, and hence it is possible to more accurately determine whether or not the component E has been successfully mounted at the mounting position Pa.

The remaining effects of the third embodiment are similar to those of the aforementioned first or second embodiment.

MODIFICATIONS

The embodiments disclosed this time must be considered as illustrative in all points and not restrictive. The range of the present disclosure is shown not by the above description of the embodiments but by the scope of claims for patent, and all modifications within the meaning and range equivalent to the scope of claims for patent are further included.

Figure 12:
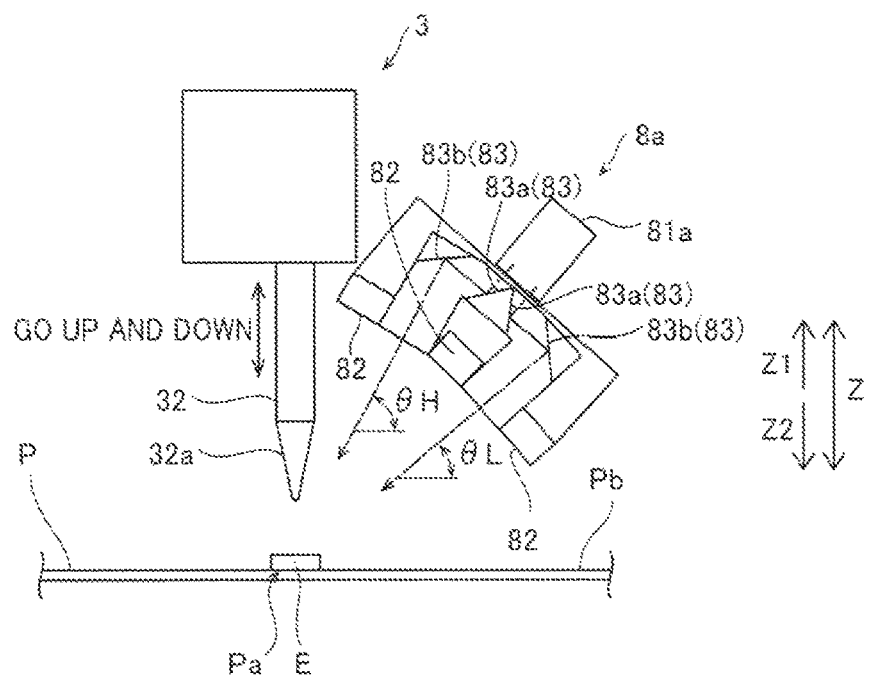
FIG. 12 is a side elevational view for illustrating an imaging unit of a component mounting device according to a modification of the first to third embodiments of the present disclosure.

For example, while the example in which the imaging unit is configured to be capable of imaging the mounting position from the plurality of (two) imaging directions by the plurality of (two) mounting position recognition cameras has been shown in each of the aforementioned first to third embodiments, the present disclosure is not restricted to this. According to the present disclosure, the imaging unit may be configured to be capable of imaging the mounting position from the plurality of imaging directions by a single mounting position recognition camera. For example, as in a modification shown in FIG. 12, an imaging unit 8a includes a single mounting position recognition camera 81a, illuminators 82, and an optical system 83 including a mirror 83a and mirrors 83b. Furthermore, the imaging unit 8a is configured to be capable of imaging a mounting position from a plurality of imaging directions by dividing the field of view of the single mounting position recognition camera 81a by the optical system 83. The imaging unit 8a is an example of an "imaging apparatus" or an "imaging section."

While the example in which the imaging unit is configured to be capable of imaging the mounting position from the two imaging directions has been shown in each of the aforementioned first to third embodiments, the present disclosure is not restricted to this. According to the present disclosure, the imaging unit may be configured to be capable of imaging the mounting position from three or more imaging directions. In this case, the height information (the information about the height of the mounting position and the information about the height of the substrate surface) may be acquired by stereo matching based on imaging results from the three or more imaging directions.

While the example in which the three-dimensional image 50 is acquired and it is determined whether or not the component E has been successfully mounted at the mounting position Pa based on the acquired three-dimensional image 50 has been shown in the aforementioned first embodiment, and the example in which the three-dimensional image 150 and the three-dimensional image 160 are acquired and it is determined whether or not the component E has been successfully mounted at the mounting position Pa based on the acquired three-dimensional image 150 and three-dimensional image 160 has been shown in the aforementioned second embodiment, the present disclosure is not restricted to this. According to the present disclosure, it may be determined whether or not the component has been successfully mounted at the mounting position without acquiring any three-dimensional image. For example, it may be determined whether or not the component has been successfully mounted at the mounting position based on the information about the height of the mounting position or a change in the information about the height of the mounting position before and after mounting without acquiring any three-dimensional image.

While the example in which both the information about the height of the mounting position and the information about the height of the substrate surface are acquired based on the imaging result of the predetermined region imaged during the period from the time point at which the head finishes mounting the component at the mounting position to the time point at which the head completes upward movement from the mounting position has been shown in the aforementioned first embodiment, the present disclosure is not restricted to this. According to the present disclosure, at least the information about the height of the mounting position may be acquired based on the imaging result of the predetermined region imaged during the period from the time point at which the head finishes mounting the component at the mounting position to the time point at which the head completes upward movement from the mounting position. In this case, during a period from a time point at which the head waits above the mounting position to a time point at which the head completes downward movement to the mounting position, the predetermined region may be imaged by the imaging unit, and the information about the height of the substrate surface may be acquired based on this imaging result. Also according to this structure, it is possible to acquire the information about the height of the substrate surface while significantly reducing or preventing a loss of the time taken for production.

While the example in which (the value of) the height information on the measurement line L1 in the three-dimensional image 150 before mounting of the component E and (the value of) the height information on the measurement line L2 in the three-dimensional image 160 after mounting of the component E are acquired in order to acquire a change in the height information before and after mounting has been shown in the aforementioned second embodiment, the present disclosure is not restricted to this. According to the present disclosure, the measurement line may not necessarily be set in the three-dimensional image in order to acquire a change in the height information before and after mounting. For example, the height information in the entire three-dimensional image may be acquired without setting the measurement line in order to acquire a change in the height information before and after mounting.

While the example in which (the value of) the height information on one measurement line L1 and (the value of) the height information on one measurement line L2 are acquired has been shown in the aforementioned second embodiment, the present disclosure is not restricted to this. According to the present disclosure, (values of) the height information on a plurality of measurement lines L1 and (values of) the height information on a plurality of measurement lines L2 may be acquired. In this case, a change in the height information before and after mounting can be more accurately acquired based on (the values of) the height information on the plurality of measurement lines L1 and (the values of) the height information on the plurality of measurement lines L2.

While the example in which the controller generates the difference image has been shown in the aforementioned third embodiment, the present disclosure is not restricted to this. According to the present disclosure, an image processing section may be provided in the imaging unit to generate the difference image by the image processing section of the imaging unit, and the generated difference image may be output from the imaging unit to the controller.

While the processing performed by the controller is described, using the flow described in a manner driven by a flow in which processing is performed in order along a processing flow for the convenience of illustration in each of the aforementioned first and second embodiments, the present disclosure is not restricted to this. According to the present disclosure, the processing performed by the controller may be performed in an event-driven manner in which processing is performed on an event basis. In this case, the processing may be performed in a complete event-driven manner or in a combination of an event-driven manner and a manner driven by a flow.

The invention claimed is:

1. A component mounting device comprising:
   a mounting apparatus having a mounting head and configured to mount a component at a mounting position on a substrate;
   an imaging apparatus having a camera and configured to image a predetermined region including the mounting position and a vicinity of the mounting position at the same time; and
   a controller configured to control the imaging apparatus to image the predetermined region during a period from a time point at which the mounting apparatus finishes mounting the component at the mounting position to a time point at which the mounting apparatus completes upward movement from the mounting position, acquire information about a height of the mounting position and a height of a substrate surface of the substrate in the vicinity of the mounting position based on an imaging result of the predetermined region imaged by the imaging apparatus, and determine whether the component has been successfully mounted at the mounting position based on the acquired information about the height of the mounting position and the height of the substrate surface.

2. The component mounting device according to claim 1, wherein
   the controller is configured to determine whether or not the component has been successfully mounted at the mounting position based on the information about the height of the mounting position taking into account the acquired information about the height of the substrate surface.

3. The component mounting device according to claim 1, wherein
   the controller is configured to determine whether the component has been successfully mounted at the mounting position by determining whether at least a predetermined amount of a portion having a height at least equal to a predetermined height is included based on the information about the height of the mounting position.

4. The component mounting device according to claim 1, wherein the controller is configured to control the imaging apparatus to image the predetermined region before and after mounting of the component, to acquire the information about the height of the mounting position before and after mounting of the component based on imaging results of the predetermined region before and after mounting of the component imaged by the imaging apparatus, and to determine whether the component has been successfully mounted at the mounting position based on a change in the acquired information about the height of the mounting position before and after mounting of the component.

5. The component mounting device according to claim 1, further comprising an image processor configured to generate a difference image between an image of the mounting position before mounting of the component captured by the imaging apparatus and an image of the mounting position after mounting of the component captured by the imaging apparatus, wherein the controller is configured to determine whether the component has been successfully mounted at the mounting position based on the generated difference image in addition to the information about the height of the mounting position.

6. The component mounting device according to claim 1, wherein the imaging apparatus is configured to image the mounting position from a plurality of imaging directions; and the controller is configured to control the imaging apparatus to image the predetermined region from the plurality of imaging directions during the period from the time point at which the mounting apparatus finishes mounting the component at the mounting position to the time point at which the mounting apparatus completes upward movement from the mounting position, and to acquire the information about the height of the mounting position based on imaging results of the predetermined region imaged by the imaging apparatus from the plurality of imaging directions.

7. The component mounting device according to claim 6, wherein the imaging apparatus is configured to image the mounting position from the plurality of imaging directions inclined with respect to the substrate surface.

* * * * *